United States Patent [19]

Baldi et al.

[11] Patent Number: 4,897,365

[45] Date of Patent: Jan. 30, 1990

[54] REDUCED-BEAK PLANOX PROCESS FOR THE FORMATION OF INTEGRATED ELECTRONIC COMPONENTS

[75] Inventors: Livio Baldi, Agrate Brianza; Daniela Beardo, Milan; Marco Icardi, Cairo Montenotte; Adriana Rebora, Milan, all of Italy

[73] Assignee: SGS Microelecttronica S.P.A., Catania, Italy

[21] Appl. No.: 124,440

[22] Filed: Nov. 23, 1987

Related U.S. Application Data

[63] Continuation of Ser. No. 784,324, Oct. 4, 1985, abandoned.

[30] Foreign Application Priority Data

Oct. 23, 1984 [IT] Italy ..................... 23283 A/84

[51] Int. Cl.$^4$ ......................... H01L 21/316
[52] U.S. Cl. ......................... 437/69; 437/70; 437/228; 148/DIG. 117; 148/DIG. 131; 156/643; 156/653
[58] Field of Search ............ 437/241, 242, 228, 69, 437/70; 156/643, 651, 652, 653; 148/DIG. 117, DIG. 131

[56] References Cited

U.S. PATENT DOCUMENTS

| | | | |
|---|---|---|---|
| 4,080,718 | 3/1978 | Riceman | 29/571 |
| 4,330,931 | 5/1982 | Liu | 29/571 |
| 4,376,672 | 3/1983 | Wang et al. | 156/643 |
| 4,454,647 | 6/1984 | Joy et al. | 29/576 W |
| 4,484,979 | 11/1984 | Stocker | 156/643 |
| 4,551,910 | 11/1985 | Patterson | 29/576 W |
| 4,563,227 | 1/1986 | Sakai et al. | 148/187 |

OTHER PUBLICATIONS

Mele et al, "Selective and Anisotropic RIE of LPCVD $Si_3N_4$ with $CH_3$ based Gases", *J. Vac. Sc. Tech.* B2(4), Oct.-Dec. 1984, pp. 684-687.

Chang, "Selective RIE of $SiO_2$", in *Solid State Technology*, Apr. 1984, pp. 214-219.

Chinn et al., "RIE for Submicron Structures", *J. Vac. Sc. Technol.*, 19(4), Nov./Dec. 1981, pp. 1418-1422.

Broydo, "Important Considerations in Selecting Anisotropic Plasma Etching Equipment", *Solid State Technology*, Apr. 1983, pp. 159-165.

Kure, T. et al., "VLSI Device Fabrication Using a Unique Highly Selective $Si_3N_4$ Dry Etching", IEDM Technology Digest, 1983, pp. 757-759.

*Primary Examiner*—Brian E. Hearn
*Assistant Examiner*—T. N. Quach
*Attorney, Agent, or Firm*—Cushman, Darby & Cushman

[57] ABSTRACT

A method for reducing birdbeaks formed during a planox process is disclosed. On a silicon substrate (1), oxide (2) and nitride (3) are formed. The oxide and nitride are then selectively etched using a single plasma having high selectivity with respect to silicon and a photoresist mask (4). The high selectivity toward silicon is achieved by use of a $CHF_3 + CO_2$ plasma under conditions of 30:1 oxide/silicon selectivity. Field oxide regions (5) with reduced birdbeaks can then be formed.

2 Claims, 1 Drawing Sheet

REDUCED-BEAK PLANOX PROCESS FOR THE FORMATION OF INTEGRATED ELECTRONIC COMPONENTS

This is a continuation of application Ser. No. 784,324, filed Oct. 4, 1985, which was abandoned upon the filing hereof.

BACKGROUND OF THE INVENTION

The present invention relates to a reduced beak planox process for the formation of integrated electronic components.

Planox technology, i.e. with oxide grown in selected zones of a plane surface of silicon, is commonly used for field insulation in MOS and CMOS processes because it provides self-alignment of insulation implantation and avoids steep steps at the edge.

It calls for the following sequence of process steps:
a. growth of thin oxide (30-90 nm) on a silicon substrate;
b. deposit of a thin layer of silicon nitride (90-300 nm);
c. deposit of a photoresist and masking;
d. etching of the silicon nitride, typically in a plasma, selective toward the underlying oxide, with removal of nitride from the zone where the field oxide is to be grown;
e. removal of the photoresist;
f. optional removal of the initial oxide from the zone no longer covered with nitride and growth of the field oxide;
g. removal of the residual nitride and the underlying initial oxide and definition of the active areas not provided with field oxide.

The major drawback of present planox technology lies in the so-called 'bird beak', i.e. the growth of oxide wedges under the nitride at the edges of the area it covers. This phenomenon involves a loss of 0.5-1 micron of the nominal dimensions of the active area and hence limits the density of the circuits.

It is known from the literature that the length of the planox beak is directly proportionate to the thinness of the nitride and the thickness of the underylying oxide.

At the same time present methods of etching nitride in plasma or in RIE (reactive ion etch) are somewhat selective toward the oxide but etch silicon much faster than they etch nitride.

The ratio of oxide thickness to nitride thickness therefore cannot be reduced very much because of the risk during nitride etching of also etching all the oxide with consequent etching of and serious damage to the underlying silicon.

Chemical etching of the nitride provides greater selectivity but is preferably in disuse because of high concentration of defects and poor dimension control.

At present, efforts in this area are mainly directed toward finding plasma or R.I.E. nitride etching processes which would be more selective toward the oxide. But satisfactory solutions to the problem are not available.

SUMMARY OF THE INVENTION

The object of the present invention is to achieve a planox process for integrated electronic components which would limit the extent of the bird beak and hence of the associated dimensional losses while retaining good yield and dimension control.

In accordance with the invention the object is achieved by a planox process which comprises the steps of thin oxide growth on a silicon substrate, deposit of a nitride layer, deposit of photoresist and masking, etching of the nitride on the sides of the zones destined to become active areas of the component, removal of the photoresist, growth of the field oxide around those zones, and removal of the residual nitride and underlying initial oxide from those zones, characterized in that said nitride etching is done with RIE etching technology which is poorly selective toward the oxide, but very selective toward silicon.

This makes possible nitride etching and, optionally, etching of the underlying oxide with no danger of damaging the silicon. The oxide layer can thus be thinner (less than 10 nm) and consequently originate a very small bird beak. Dimensional losses thus become negligible and there are no undesirable losses of yield and dimensional control.

Suitable RIE etching technology with high selectivity toward silicon is used commercially for etching contacts. This technology provides nitride etching only slightly slower than oxide etching, while etching stops spontaneously on the silicon.

In particular, a machine may be used for the RIE etching known in trade under the name A.M.E. 8111 which uses a $CHF_3 + CO_2$ plasma with 75 cc/min of $CHF_3$ and 6 cc/min of $CO_2$. The power employed is 1300 watts at 13.5 MHz and pressure is 60 mTorr. Oxide etching speed is 450 Å/min and silicon etching speed is 15 Å/min. Oxide/silicon selectivity is therefore 30:1.

BRIEF DESCRIPTION OF THE DRAWINGS

To better understand the process in accordance with the invention reference may be made to the annexed drawings wherein.

DETAILED DESCRIPTION

Figure 1:
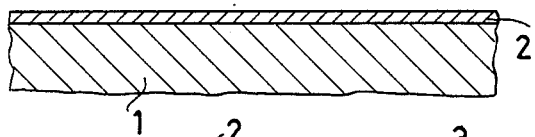
FIGS. 1-7 show the various steps of the process in succession.

It is seen in FIG. 1 that on a silicon substrate 1 is initially grown a thin oxide 2, preferably less than 10 nm thick.

Figure 2:
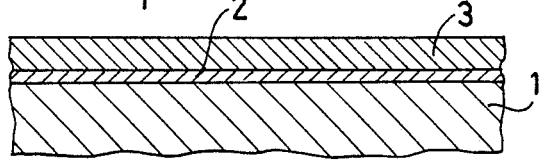

On the oxide 2 is then deposited a layer of silicon nitride 3 (FIG. 2) preferably thicker than 200 nm.

Figure 3:
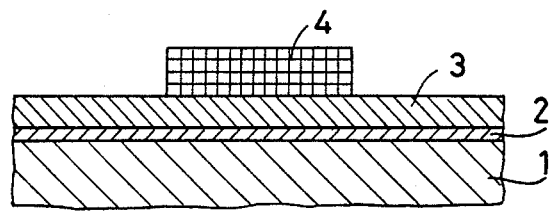

After deposit of a photoresist 4 (FIG. 3) on the zone destined to become an active area of the component and appropriate masking, etching of the nitride 3 and the oxide 2 is performed with RIE (reactive ion etch) technology which is highly selective toward silicon. In particular, the aforesaid A.M.E. 8111 machine may be used with $CHF_3 + CO_2$ plasma.

Figure 4:
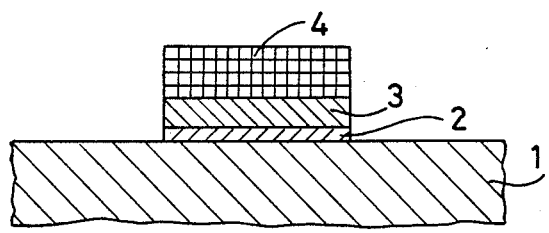

This gives the structure shown in FIG. 4 which may be subjected to ion implantation for correction of dope concentration on the surface of unprotected zones.

Figure 5:
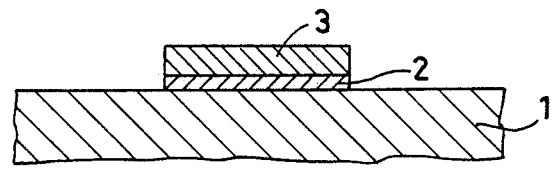

After removal of the photoresist 4, the structure assumes the appearance shown in FIG. 5, i.e. the silicon substrate is covered with a thin oxide layer 2 and a nitride layer 3 only in the zone destined to become the active area.

Figure 6:
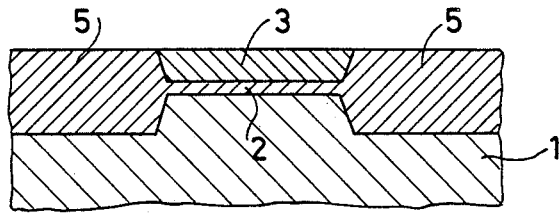

After optional cleaning of the silicon surface, field oxide 5 is grown at the sides of the aforesaid zone and penetrates partially into the silicon substrate 1, giving the component the conformation shown in FIG. 6, practically without oxide growth under the nitride 3. This last characteristic is clearly the result of the thinner oxide 2.

Figure 7:
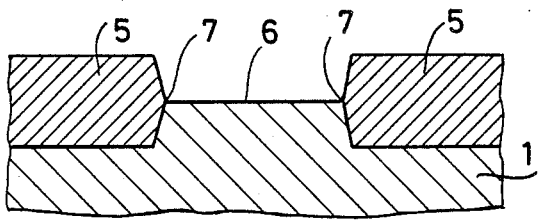

Residual nitride 3 and the underlying initial oxide 2 are then removed to provide a final component such as the one shown in FIG. 7 having a well-defined active area 6 with minimal dimensional loss due to formation of bird beak 7.

We claim:

1. A method for reducing oxide wedges or bird beaks formed during a planox process for the formation of integrated electronic components, said method comprising the steps of:

(a) growing a layer of oxide on a silicon substrate, said layer having a thickness of 10 nm or less;

(b) depositing a layer of silicon nitride on said oxide layer;

(c) depositing a photoresist layer on selected areas of said silicon nitride layer, along with appropriate masking; said selected areas being those areas which will become active areas of the electronic components;

(d) etching, by use of one plasma having high selectivity with respect to silicon, the nitride and oxide layers previously deposited so as to remove those nitride and oxide layers surrounding said selected areas, thereby exposing the silicon surrounding said selected areas;

(e) removing said photoresist layer from said selected areas;

(f) growing a field oxide layer around said selected areas on the surface of said exposed silicon substrate; and (g) removing residual oxide and silicon nitride from said selected areas so as to expose the silicon substrate in said selected areas.

2. The process of claim 1 wherein said high selectivity toward silicon is achieved by use of a $CHF_3 + CO_2$ plasma under conditions of 30:1 oxide/silicon selectivity.

* * * * *